(12) United States Patent
McNabb (10) Patent No.: US 6,550,521 B1
(45) Date of Patent: Apr. 22, 2003

(54) SEAMLESS SCREEN VIDEOWALL (75) Inventor: Ira McNabb, Fullerton, CA (US)

(73) Assignee: Visual Structures, Inc., Los Alamitos, CA (US)

( * ) Notice: Subject to any disclaimer, the term of this patent is extended or adjusted under 35 U.S.C. 154(b) by 26 days.

(21) Appl. No.: 09/580,887

(22) Filed: May 30, 2000

(51) Int. Cl.$^7$ .............................................. A47G 5/00
(52) U.S. Cl. ....................... 160/135; 359/457; 359/460
(58) Field of Search ................................ 211/198, 199, 211/169; 160/351, 135; 40/606, 610, 605; 248/158; 359/457, 443, 460

(56) References Cited

U.S. PATENT DOCUMENTS

| | | | |
|---|---|---|---|
| 4,667,833 A | * | 5/1987 | Jamison ...................... 211/198 |
| 5,011,277 A | | 4/1991 | Ogino |
| 5,206,760 A | | 4/1993 | Nakashima |
| 5,382,990 A | | 1/1995 | Hata |
| 5,640,272 A | | 6/1997 | Furuya |
| 5,746,599 A | | 5/1998 | Lechner |
| 5,897,192 A | | 4/1999 | Seufert |
| 5,927,985 A | | 7/1999 | Lechner |
| 6,000,668 A | | 12/1999 | Mannick |

FOREIGN PATENT DOCUMENTS

| | | |
|---|---|---|
| DD | 237948 | 7/1986 |
| DE | 9005951 | 11/1990 |
| DE | 9303121 | 4/1993 |
| EP | 2286109 | 10/1988 |
| EP | 523427 | 1/1993 |
| EP | 1597739 | 5/1994 |
| EP | 623839 | 11/1994 |
| EP | 650295 | 4/1995 |
| EP | 687108 | 12/1995 |
| EP | 689352 | 12/1995 |
| EP | 764875 | 3/1997 |
| FR | 464663 | 8/1992 |
| GB | 1455377 | 11/1976 |
| GB | 2222760 | 3/1990 |
| JP | 1302338 | 12/1989 |
| JP | 2941292 | 4/1990 |
| JP | 3-45987 | 2/1991 |
| JP | 3-90184 | 9/1991 |
| JP | 2960512 | 5/1992 |
| JP | 5-56375 | 3/1993 |
| JP | 7270914 | 10/1995 |
| JP | 7319071 | 12/1995 |
| JP | 8152677 | 6/1996 |
| JP | 9172593 | 6/1997 |

* cited by examiner

Primary Examiner—Anita King
Assistant Examiner—Gwendolyn Baxter
(74) Attorney, Agent, or Firm—Curtis L. Harrington (57) ABSTRACT

A system for suspending a video projection screen includes the principles of physical independence, or a somewhat "floating system," employing at least some thermal expansion matching, centroid expansion dimension splitting combined with front to back progressive dimensional freedom, as well as corner gussets and rear corner brackets which contribute to the overall independence of each element of the system. The system of support provide clearance space from the rear of the system and which progressively provides a final touching clearance at the projection end of the system which has the minimum spacing between adjacent acrylic members to provide a nearly seamless system. In one embodiment, an expanse of typical acrylic screen material which may be either case, such as a Fresnel, or lenticular-fresnel material, or extruded, such as a diffusion material, having a thermal expansion of about $34 \times 10^{-6}$ inch/inch/° F. A polycarbonate strip of material is attached to the four edges of the acrylic screen, and to an extruded polycarbonate frame, preferably black and preferably having a thermal expansion coefficient substantially similar to that of the acrylic screen material, the polycarbonate frame having a thermal expansion coefficient such as about $38 \times 10^{-6}$ inch/inch/° F.

17 Claims, 4 Drawing Sheets

SEAMLESS SCREEN VIDEOWALL

BACKGROUND OF THE INVENTION

The present invention relates to the use of closely spaced video screen systems sometimes known as a video wall and which enables the construction of a wide variety of configurable cells in a closely spaced relationship in an inexpensive manner but without the distorting effects from thermal and moisture cycling.

Video screens are typically made from polymethyl methacrylate, or acrylic. Single unit systems such as are used in big screen video projection systems usually do not present a problem especially where the screen can be suspended using force members on a frame. However, in custom installations of multiple screens, the object is to achieve high density in multiple screen structures, typically in some configuration of a "wall" or continuous planar array of such screens. Where extremely close spacing is required or desired, the availability to add tensioning structures is eliminated.

In conventional vide wall video screen projection systems, a frame work is made of steel or aluminum. Since the thermal expansion coefficient of acrylic, about $34 \times 10^{-6}$ inch/inch/° F., is about two to three times greater than the expansion coefficient for either steel, from about $8.4 \times 10^{-6}$ inch/inch/° F. to about $15 \times 10^{-6}$ inch/inch/° F., or aluminum, from about $9 \times 10^{-6}$ inch/inch/° F. to about $13 \times 10^{-6}$ inch/inch/° F., differential expansion an contraction will occur. The differential expansion and contraction will create screen distortion if the cut and fit sizing of the screens in the frames was performed under different thermal conditions than the operating conditions. While all screen system are subject to fluctuating ambient conditions, screen distortion will occur if the screen(s) expand in a fixed frame if the frame itself cannot expand.

Further, acrylic is hygroscopic and expands with increased humidity regardless of temperature. Humidity conditions can produce a marked differential expansion of the acrylic material with respect to steel and aluminum which are unaffected. Both of these effects cannot be compensated for unless absolute humidity and temperature is maintained from the time the screen frame structure is constructed and the acrylic is cut to fit the individual cell structure and throughout the operable life of the assembled screen structure. This requirement is not achievable, even where desired, due to high operating cost and the probability of heating, ventilation and air conditioning failure and power failures.

In general, the distortions are caused by making the acrylic screen large enough such that expansion may impinge the frame and cause the plane of the acrylic screen to bend out of plane, either inward or outward, a process known as "oil canning". Movement of part of the acrylic screen out of its plane causes a de-focussing of the video projected image. On the other hand, where the acrylic video screens are cut smaller than the frame sizes, a shrinking of the acrylic screen with respect to its steel or aluminum frame can cause the creation of a gap between the edge of the acrylic screen and the metal frame. At best, an unacceptable light gap occurs and the project light is glaringly directed at the eyes of the viewer. At worse, the edge of the screen may be displaced forward or rearward to combine glare with a partially out of focus screen.

One solution to the expansion problem has been the use of a polycarbonate sheet as an intermediate attachment member between the screen and frame. Adjoining screens have a separation of from one and a half to two millimeters to allow expansion and contraction of the screens to operate within the gap, with each screen presumably occupying half of the space assuming both expand and contract at the same time.

In another solution, screens are cut to exact size and holes drilled about the periphery of the screens. The screens are then literally stitched, during the on-site construction activity, with "U" shaped steel wires to a flexible steel frame. The flexible steel is mounted to the substantial metal framework. The labor required in this system is tremendously greater than in other systems, and the three body system utilizes the flexible metal strip for expansion and contraction.

SUMMARY OF THE INVENTION

To meet the above described need, a system for suspending a video projection screen includes the principles of physical independence, or a somewhat "floating system," employing at least some thermal expansion matching, centroid expansion dimension splitting combined with front to back progressive dimensional freedom, as well as corner gussets and rear corner brackets which contribute to the overall independence of each element of the system. The system of support provide clearance space from the rear of the system and which progressively provides a final touching clearance at the projection end of the system which has the minimum spacing between adjacent acrylic members to provide a nearly seamless system.

In one embodiment, an expanse of typical acrylic screen material which may be either case, such as a Fresnel, or lenticular-fresnel material, or extruded, such as a diffusion material, having a thermal expansion of about $34 \times 10^{-6}$ inch/inch/° F. A polycarbonate strip of material is attached to the four edges of the acrylic screen, and to an extruded polycarbonate frame, preferably black and preferably having a thermal expansion coefficient substantially similar to that of the acrylic screen material, the polycarbonate screen having a thermal expansion coefficient such as about $38 \times 10^{-6}$ inch/inch/° F. Thus, only the example given, the thermal expansion coefficient of the frame will differ from the thermal expansion coefficient of the screen by about twelve percent. Preferably the expansion coefficient of the frame will not differ from the thermal expansion coefficient of the screen by more than about thirty percent in order to remain substantially similar. A space is maintained between the rear face of the acrylic screen expanse and the rigid extruded framework of aluminum or steel. The gap is made opaque by a black masking material.

The construction of the invention allows the frame to expand and contract substantially in unison with the screen, thus keeping the screen flat and the projected video image in focus.

BRIEF DESCRIPTION OF THE DRAWINGS

Objects and features of the invention will become apparent from a reading of a detailed description in conjunction with the drawing, in which.

DETAILED DESCRIPTION OF THE PREFERRED EMBODIMENTS

Figure 1:
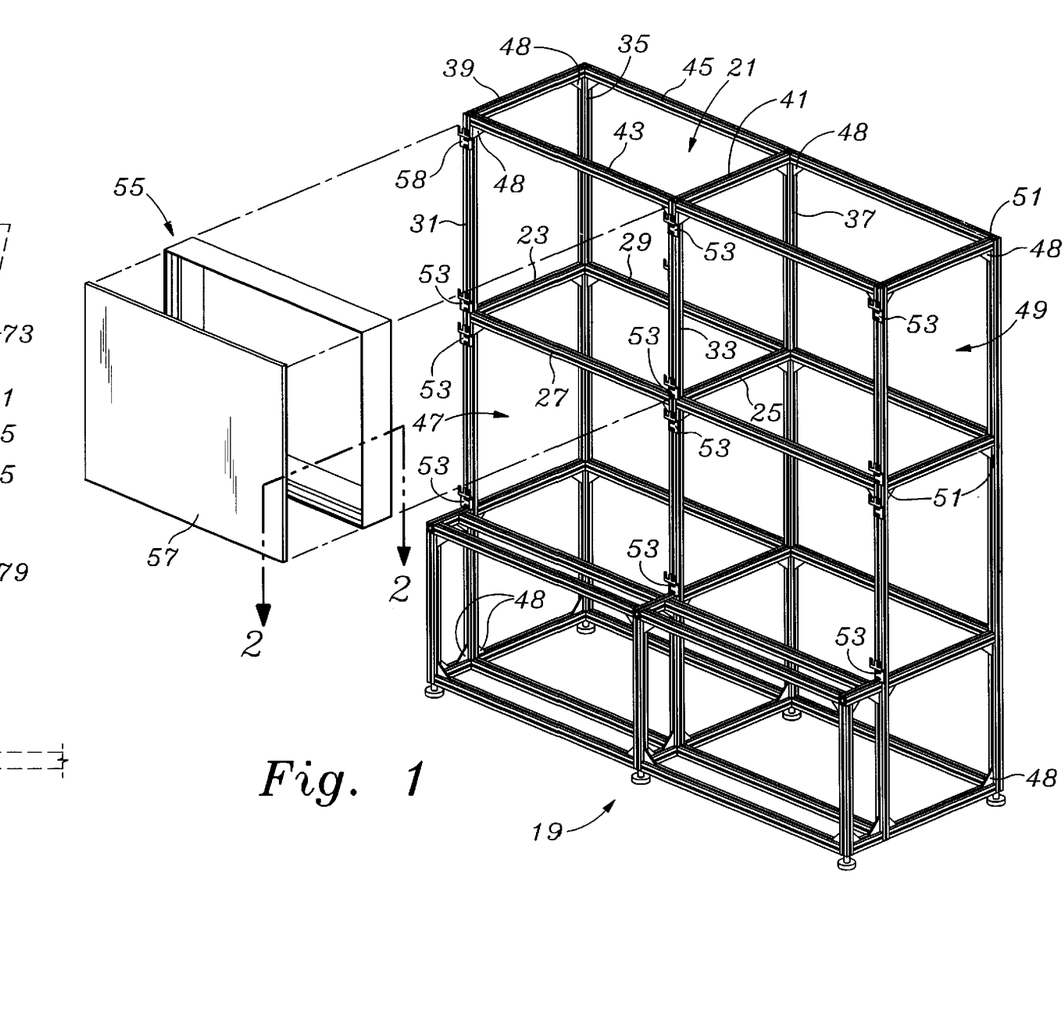
FIG. 1 is perspective view of one possible two by two configuration of a video wall support frame with a bottom accommodation space, and showing a single polycarbonate frame structure displaced from the frame, and an acrylic screen displaced from the frame.

A detailed description of the embodiments of the invention are best begun with reference to FIG. 1. A frame structure 19 consists of an assembled lattice work of both vertical members and horizontal members. For clarity of illustration, the upper left lattice is selected for discussion. A lattice member cell 21 includes lower horizontal members 23, and 25 which are parallel and opposite each other, lower horizontal members 27 and 29 which are parallel and opposite each other, and vertical members 31, 33, 35, & 37. Atop the vertical members 31, 33, 35, & 37 are a set of upper horizontal members 39, 41, 43 & 45. Below the lattice member cell 21, the lower horizontal members 23, 25, 27 & 29 form a set of upper horizontal members for the a lattice member 47 below. A further lattice member cell 49 is seen to the right of cell 21.

As will be seen, the frame structure 19 is employed to provide a stable lattice member cell 21 where an installation is to be a free standing video wall. The purpose of much of the space formed in the lattice member cells 21 and 47 are for mounting the video projectors, which will not be shown, and for running wires and cables. However, the essential objective of the stable frame structure is to provide stable support for horizontal members 27 and 43 and vertical members 31 and 33, as well as the relationship to adjacent lattice member cells 47 and 49. In other applications and structures, if sufficient support can be gathered to provide video projection through an opening similar to that defined by members 27, 43, 31, and 33, and so long as support can be obtained from other structures with a placement approximating that which is determined by the location of the members 27, 43, 31, and 33, then the inventive system can be practiced elsewhere, from other structures.

Seen in the frame structure 19 are a series of corner fittings 48 which are used to join members 23, 25, 27, 29, 31, 33, 35, 37, 39, 41, 43, & 45 and are seen at the junction of such members. The corner fittings 48 join the other members of the frame structure 19 together into a very stable lattice structure. These joining corner fittings 48 are distinguished from a series of brackets 53 which are mounted on vertical members, including vertical members 31 and 33 as well as other vertical members and leftwardly directed from the face most prominently seen in FIG. 1.

The brackets 53 which operate with respect to lattice cell 21 include two brackets 53 mounted on vertical support 31 and two brackets 53 mounted on vertical support 31. As will be seen, the brackets 53 mounted on the vertical support 33 will also serve support duty with respect to lattice cell 49. The brackets 53 mounted on vertical support 31, since there are no lattice cells to the left of lattice cell 21, will serve only the lattice cell 21. As will be seen, the brackets 53 are designed to allow only limited amounts of vertical and horizontal movement with regard to structures engaging such brackets 53.

Displaced in an exploded relationship forward of the frame structure 19 is a frame 55 which is preferably a polycarbonate frame and which may be extruded, cut and joined like a conventional picture frame, or may be custom molded. One material which has been found to work well is a polycarbonate material which is commercially available under the trade name LEXAN. The use of an extrusion which may be cut to specified sizes gives more flexibility in the construction of frames 55 of different sizes and shapes. Joinder of the individual extruded pieces may be by any method. The important objective of the frame 55 is that it have a thermal expansion substantially similar to that of an acrylic screen 57, such as about $38 \times 10^{-6}$ inch/inch/° F. Screen 57 has a front end having a front face facing away from the frame 55, and a rear end having a rear face facing the frame 55. Where the thermal expansion of the frame 55 is slightly greater than the thermal expansion of the acrylic screen 57 it is important to provide some spacing between adjacent frames 55 so that the dimensional growth of the frames does not overshadow, control or effectively communicate such growth to the closely adjacently positioned screens 57. Where the thermal expansion of the frame 55 is slightly less than the thermal expansion of the acrylic screen 57 it is important that the frames occupy a front to back spacing and flexibility of connection to enable it to take on an intermediate "expansion matching" role.

At the base of the frame structure 19, additional cross supports 59 are provided which may either directly provide support for screen 57, or other structures which provide support for screen 57, and all of the screens 57 on the bottom row of the wall of screens 57. In the structure shown in FIG. 1, a two by two video wall is to be constructed with the two lower enclosure "cells" not fitted with screens 57 but present simply for elevation, cable and wire access, and to provide additional cross supports 59 for direct bearing force support of the screens 57. At the frame structure 19 there are to be four such screens 57 in close fitting relationship, each guiding and limitingly vertically and horizontally connected to its own frame 55, and each frame 55 even less limitingly vertically and horizontally depending from the brackets 53. The brackets 53 however, are rigidly attached to the frame structure 19.

As the screens are primarily supported by their weight upon the cross supports 59, and in close proximity to each other, the main expansion horizontally at the bottom will be against the cross supports 59, or support structures provided therebetween the cross supports 59 and the screens 57. Assuming that the screens 57 expand horizontally at the same rate, the two screens 57 on the bottom will expand horizontally at the same rate as the two screens 57 atop a two by two screen stack and thus the interface between them should produce no sliding differential. In the completed structure of FIG. 1, the two bottom screens 57, one of which would be located before lattice member 47 for example, will also expand vertically, lifting the two top screens, including screen 57 seen in FIG. 1, as well as the screen located before lattice member 49. Expanding this basic geometry to an N by N stack should produce a similar growth such that the edges of all of the screens match dimension with the edge of an adjacent screen, such that the front screen array grows both horizontally and vertically as a whole unit.

By providing such two dimensional independence, the stack of screens grows and contracts outward from a centrist horizontal base. Assuming horizontal growth is allowed in the direction of both of the ends of the frame structure 19, the center divide is not expected to move. Assuming good support by the cross supports 59, the screens 57 will grow upward, and thus the base for upward growth will be the bottom of the bottom row of screens 57. As will be seen, the dimensioning of the brackets 53 are such as to accommodate a maximum movement of the uppermost of an expected height of a stack of screens 57, as will be maximally lifted by expansion, and a maximum movement of the outermost of the screens 57 of half of the horizontal distance of total expansion of the row of horizontally oriented screens 57.

In the system outlined, the screens 57 expand and contract a greater extent, while the frames 55 expand and contract only a slightly lesser or nearly equal extent, and while the frames 55 move within the brackets 53 the greatest extent. In this configuration, the screens 57 are always wholly together, achieve without separation, and yet retain an operative position with respect to video projectors mounted within the frame structure 19.

Figure 2:
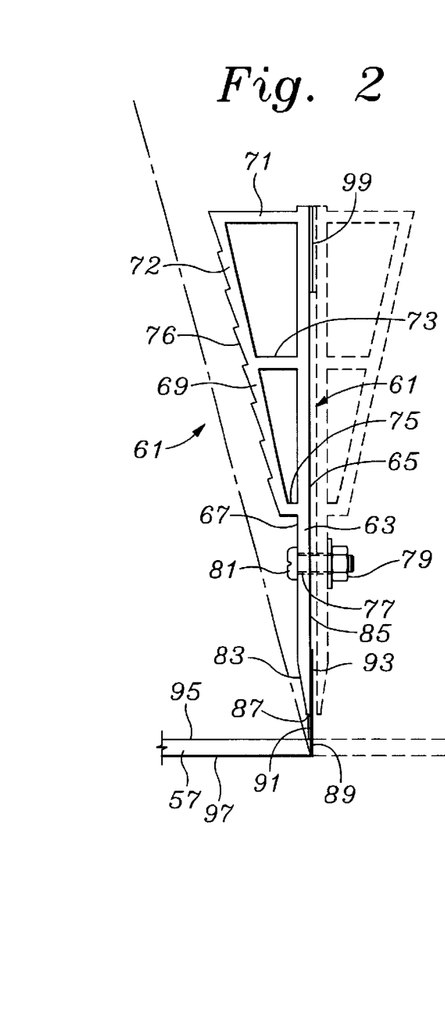
FIG. 2, is a sectional view taken along line 2—2 of FIG. 1, and illustrates the cross sectional details of one extrusion as a side of the frame seen in FIG. 1, and also in dashed line format the location of an adjacent screen & frame member which would be joined with the frame member show, but without tape which otherwise joins the screen to the frame.

Referring to FIG. 2, a sectional view taken along line 2—2 of FIG. 1 gives a sectional view of a single extrusion 61. The extrusion 61 has a flat outer wall member 63 having an outer surface 65 and an inner surface 67. Seemingly attached to the outer wall member 63 at the inner surface 67 is an inner wall 69 which forms an angle with respect to outer wall 63. A rear end wall 71 connects the rearward most end of the inner wall 69 to the rearward most end of the outer wall 63. The inner wall 69 is slanted with regard to outer wall 63 to insure that a light path from the projector mounted within lattice member cell 21, shown as an intermittently dashed line 72, which "fans out" during its propagation in the lattice member cell 21 in the direction of the extrusion 61 will not strike extrusion 61. The shape of extrusion 61 is calculated to make certain that light path 72 avoids contact with the inside of the extrusion 61. In fact, contemplating that such might occur inadvertently due to a temporary maladjustment of the projector, the surface of inner wall 69 facing the light path 72 may preferably be jagged or saw tooth shape to capture any light from the light path 72 which may fall upon it.

Another two walls are shown, which are parallel to the rear end wall 71, and include an intermediate wall 73 and a very abbreviated length front wall 75. Also seen in small format is the saw tooth or jagged inner surface 76 which is so shaped to prevent low level reflection and thus a doubling of the reflected light back onto the screen 57 in addition to the light reaching screen 57 normally.

The general shape of the extrusion 61 is achievable in other than a single piece extrusion, and separating boundaries can be made in any of the walls 75, 73, 71, as well as 63 and 69. In the alternative, the frame 55 can be formed of pieces which fit annularly with respect to each other. The central idea with the frame 55 is that a strong construction is desired, and that even though a specialized one piece construction is possible, it is not necessary. For example, the walls 71, 73, and 75 could be combined into one wall which extends between the ends of the section seen in FIG. 2 so that the entire frame 55 can be formed from a single molding operation.

Forward of the wall 75, an aperture 77 is made to accommodate a nut 79 and bolt 81 set which can be used to join adjacent frames 55 together. The nut 79 thickness profile, along with the, bolt 81 length and bolt 81 head profile will be narrow enough not to interfere with a widening video image light path extending from the rear inside of the frame 55 and toward the front end, away from the rear end wall 71. Continuing along the extrusion 61 and toward the front end, the inner surface 67 angles inwardly to form an angled surface 83 and a tapered section 85 before terminating at a terminal end 87.

Figure 8:
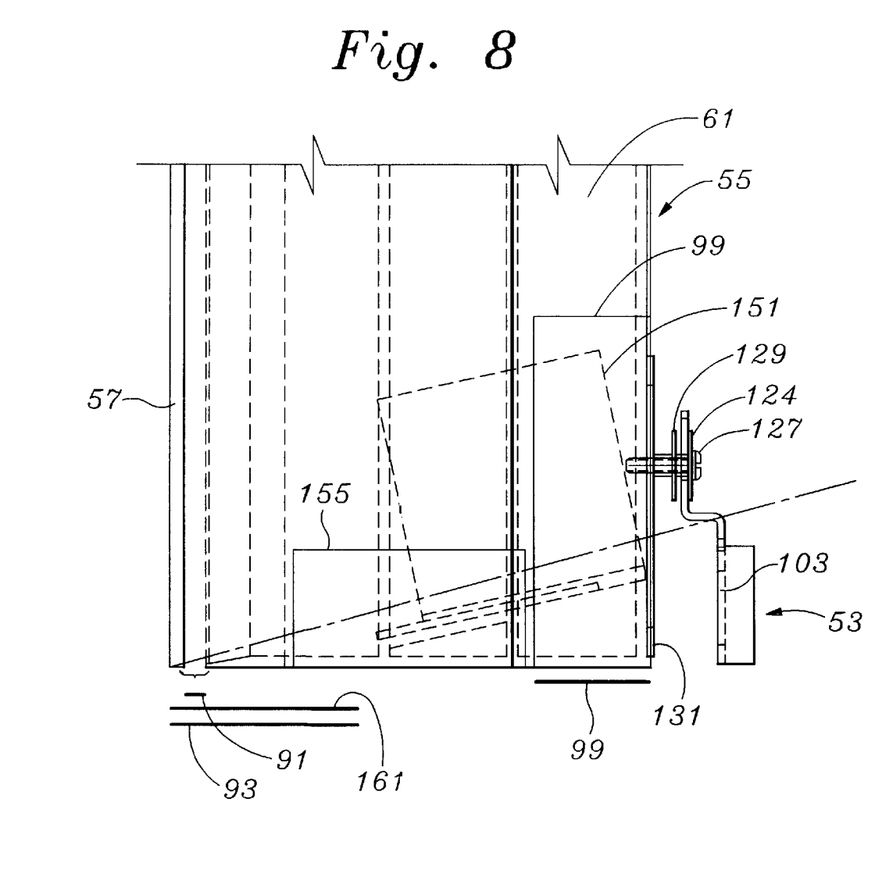
FIG. 8 is a side view of the frame 55 of FIG. 1 showing a more extreme closeup detail of the support interaction between the bracket 53, which would be attached to the frame structure 19, and the frame 55.

The terminal end 87 is seen as flat and is shown spaced apart from screen 57. The end need not be flat, and can be rounded or relatively sharper than shown, but the end, combined with the general extent of the extrusion 55 must have enough strength to coordinate support with the screen 57 through flexible members. FIG. 8 will offer a somewhat exploded view and to the side of the gap between the terminal end 87 of the extrusion 61 and a terminal edge surface 89 of the screen 57. In FIG. 2, however an abbreviated width of black tape 91 which is about the width of the gap between the terminal end 87 of the extrusion 61 and a terminal edge surface 89. A much wider and thicker width of flexible material is provide as a thin expanse of polycarbonate material as a polycarbonate layer 93 is seen which will engage the terminal edge surface 89 of the screen 57, extend across the gap between the gap between the terminal end 87 of the extrusion 61 and a terminal edge surface 89 of the screen 57, and onto the outer surface 65 of the forward portion of the extrusion 61. Between the polycarbonate layer 93, which may be commercially available under the LEXAN trademark and the surfaces to which it adheres, is a double sided adhesive transfer tape which cannot be seen in FIG. 2, but will be more fully explained in FIG. 8. Again, the polycarbonate layer 93 is preferably about 0.015 inches thick and provides a membrane attachment between screen 57 and frame 55 for maximum flexibility. The black tape 87 simply fills the gap between the polycarbonate layer 93 and its underlying adhesive transfer layer in order to further isolate any light from within one frame 55 from bleeding over into an adjacent frame.

As can be seen from FIG. 2, the only connection between the extrusion 61 and the screen 57 by its terminal edge surface 89 is the width of polycarbonate 93, perhaps against the screen 57 at an inside surface 95 which lies opposite outside surface 97. This connection is not insubstantial as the width of polycarbonate 93 completely extends around the frame 55 as well as the full extent of the edge surface shown in FIG. 2 as a terminal edge surface 89. This yields a close relationship, so long as the gap between the gap between the terminal end 87 of the extrusion 61 and a terminal edge surface 89 of the screen 57 is maintained as fairly narrow, a dimension which has been found to work well is about ⅜ of an inch, matching the width of the black tape 91. The thickness of the screen 57 depends somewhat on the material of construction, but may range from between ¼ of an inch and ⅜ of an inch. A width of width of polycarbonate 93 which has been found to be effective in constructing a video wall is about two inches. Thus, the two inch width of the width of polycarbonate 93 is taken up as from a maximum of about ⅜ of an inch width for the contact thickness of the terminal edge surface 89, about ⅜ of an inch thickness for the black tape 91, and thus leaving about 1¼ inches of width for contact onto the outer surface of the flat outer wall member 63. The combined holding force of the width of polycarbonate 93 about the outer periphery of the frame 55 is a sufficient structural link between the frame 55 and the screen 57.

However, as will be seen, much of the initiation of movement will flow from the multiplicity of screens 57 and back into the frame 55. The polycarbonate 93 is also preferably double stick to enable the next most adjacent screen 57 to be adhesively "fixed". The polycarbonate 93 is preferably about 0.015 inches thick. For a pair of screens 57 placed adjacent to each other, this equates to a screen separation dimension of 0.03 inches.

Beyond the contact of adjacent widths of polycarbonate 93, and the use of nut 79 and bolt 81 aligning connection of adjacent frames 55, the frames are not otherwise constrained to each other. At the rear of the extrusion 61 an external spacer 99 is seen adjacent the rear end wall 71. The external spacer 99 is placed around the corners of the frames 55 at the rear ends 71 of their extrusions to provide some additional joinder of the individual extrusion sections, where frame 55 is so constructed, as well as to any inadvertent contact with other frames 55 should any such contact inadvertently occur. Since it is the screens 57 which support each other from the bottom, and the frames 55 which depend from the generally less than fully constraining width of polycarbonate 93, the frames 55 have the possibility during their movement of touching or rubbing against each other. The provision of external spacer 99 provides a first point of contact between the frames 55 should they experience forces which tend to push them together at their rear portions.

Figure 3:
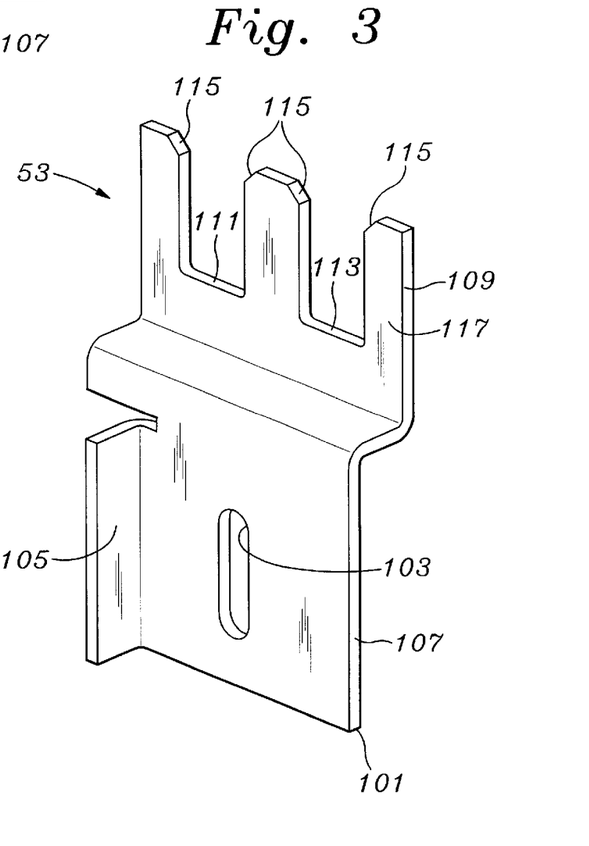
FIG. 3 is a perspective view of a bracket which allows limited lateral and vertical freedom of movement of the frame of FIGS. 1 & 2 and which is utilizable in conjunction with the support frame of FIG. 1.

Referring to FIG. 3 a perspective view of the bracket 53 is seen. The bracket 53 is dimensionally planned to provide a greater degree of freedom of movement with respect to the support of the frames 55 from the frame support structure 19 than the degree of freedom of movement of the front of the frames 55 are able to achieve from what is formed as a generally rigidly defined screen 57 matrix. The rigid definition comes generally from the 0.03 inch spacing and separation by two thicknesses of tape.

The bracket 53 is engineered and designed to enable a spreading of any motion from expansion or contraction of the screens 57 as evenly as possible among all of the lattice member cells 21, 47, 49, and others as provide rear support to the screens 57. Bracket 53 has a first planar portion 101 having a single slot 103 which extends generally centered below the uppermost extent of the bracket 53. Generally the slot 103 will provide enough vertical attachment freedom so that regardless of whether a hole drilled or tapped into any of the vertical members 31, 33, for example is vertically off, that the bracket 53 can be aligned.

Adjacent the first planar portion 101 is an alignment stop 105 which is a smaller planar portion which extends generally perpendicularly from the planar portion 101. Thus, where the frame structure 19 is selected with members 23, 25, 27, 29, 31, 33, 35, 37, 39, 41, 43, & 45 which are so well tolleranced that the positions of such members are known, the alignment stop 105 enables the frame structure 19 to be quickly constructed without having to worry about mis alignment of holes which use bolts to engage the slot 103. Once bolts or threaded members extend through the slot 103, the alignment stop 105 can be used to align the bracket 53 exactly with respect to the vertical members 31, 33, and others. The width of the slot 103 should be sufficient to enable the bracket 53 to accommodate some differences in the width of the member to which it is attached despite some differences in drilling the centerline of accommodation bores for slot 103, as well as to insure that the alignment stop 105 can extend around any obstruction.

The side of the planar portion 101 most prominently disposed in FIG. 3 is a side 107 which abuts one of the vertical members 31, 33 seen in FIG. 19. From the planar portion 101 upper end, an "S" or standoff curve extends away from the side 107 and then upward generally parallel to the first planar portion 101 in a planar slot portion 109. Planar slot portion 109 includes a pair of spaced apart slots, including a first slot 111 and a second slot 113.

The width and depth of slots 111 and 113 are chosen to provide the maximum reasonably allowable horizontal and vertical movement of the frames 55 which they engage. The movement is based upon the use of a projecting member having at least an expanded member which cannot fit through the slots 111 and 113, but which provides support no matter in which position a bolt or projecting member engaging the slots 111 and 113 may move within the slots 111 and 113.

In a preferred embodiment, and these dimensions may change with the overall size of the bolt, and any spacers used (see FIG. 4) and which is preferably about ¼ of an inch in diameter. The slots 111 and 113 each have a pair of beveled entries 115. Including the vertical height of the beveled entries 115, the depth of the slot is about 1.189 inches in height. Given the ¼ of an inch taken up by a bolt engaging the slots 111 and 113, this leaves 0.939 inches for the bolt to wander or "float" in the vertical direction, although this magnitude is greater than any vertical displacement expected, and a greater than expected vertical displacement ability is provided in order to insure that the frame 55 remains securely fastened. The width of each of the slots 111 and 113 is 0.750 inches. Again, given the ¼ of an inch taken up by a bolt engaging the slots 111 and 113, this leaves 0.500 inches for the bolt to wander or "float" in the horizontal direction. However, where a preferred spacer sleeve having an external diameter of about ⁷⁄₁₆ of an inch, this leaves 0.375 inches for the bolt and spacer combination to "float" in the horizontal direction. The amount of horizontal "float" is ideally about the same effective magnitude for movement as would be effectively expected as an operating range for the vertical magnitude, the excess being provided to insure that the frames 55 do not disengage if the bolts or protruding members have reached or exceeded their expected vertical movement.

A surface 117 of the planar slot portion 109 which faces the same side of the bracket 53 as the surface 107 is displaced from the surface 107 by 0.625 inches. 0.625 inches is sufficient to accommodate any bolt heads and washers between the plane of surfaces 107 and the plane of surface 117, and prevent binding on the rear of the frame 55. The slots 111 and 113 are intended to each support a different member of a frame 55. The separation between the slots 111 and 113 is 0.625 inches, but the separation of the centers of the slots 111 and 113 is about 1.375 inches. The transition from the planar slot portion 109 to the first planar portion 101 is seen to be somewhat curved in a radiused bend fashion, but can be of any shape.

Figure 4:
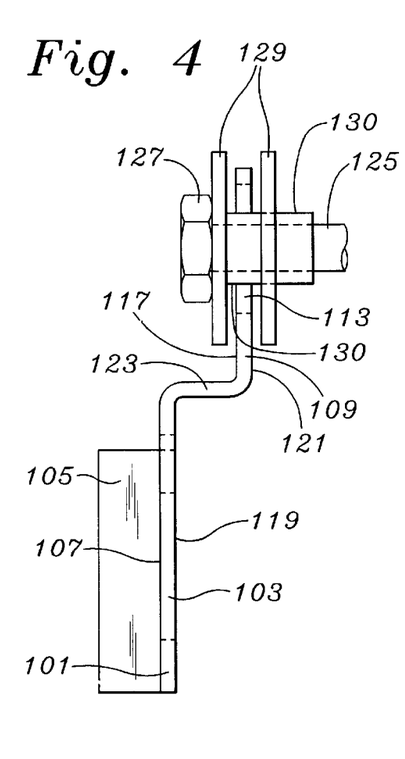
FIG. 4 is a side view of the bracket seen in FIG. 3 and further illustrating engagement with a bolt flanked by two washers on either side of a planar slot portion displaced from a main planar portion to accommodate at least the bolt head and one washer, and shown generally in the center of one of the two slots to illustrate the vertical freedom afforded, in addition to lateral freedom of movement of the bolt within the slot.

Referring to FIG. 4, a side profile of the bracket 53 is seen, and a side surface 119 is seen opposite surface 107, while a side surface 121 is seen opposite surface 117. A transition portion 123 between the first planar portion 101 and the planar slot portion 109 is seen. Also seen is a bolt 125 having a head 127 engaging a washer 129 against the surface 117. The washer 129 is large enough that the bolt 125 can shift position within either of the first slot 111 and second slot 113 without allowing the head 127 nor washer 129 to move through the first slot 111 and second slot 113. A second washer on the other side of the bracket 53 is illustrated and preferred. Further, an optional, but preferred sleeve or spacer 130 is seen between the washers 129 as well as a portion extending beyond washer 129 in a direction opposite head 127. Spacer 130 can exist as a one piece structure with a land instead of the rightmost washer 130 seen in FIG. 4, or it can exist as a pair of spacers 130, with a first spacer separating the washers 129 and a second being set between the washer 129 and the point of entry of the bolt 125 into the extrusion 61 or bracket on the extrusion 61 to be shown in FIG. 6. The spacer 130 between the washers 129 sets the permissible movement forward and rearward with respect to the frame 55. The spacer 130 between the washer 1290 and the tip of the bolt 125 (not shown) sets the depth of the bolt with respect to the frame 55 or any bracket or other structure upon the frame 55. Further, the use of spacers 130 also reduce wear on the bolt 125, as well as to set a displacement along the axis of the bolt 125 in which the bolt 125 can translate across the bracket 53. The length of the sleeve 130 can be varied to limit the movement available to the bolt 127 assembly with its washers 129 through the bracket 53. The setting of the bolt 125 into the extrusion 61 or fitting (see FIG. 6) should be pre-set to insure that the assembly seen in FIG. 4 is not so loose that the bracket 53 could touch the bolt 125 on either side of the sleeve 130. Such contact can cause binding and is undesirable. Selection of the material of the bolt 125, its characteristics, selection of the bracket 53 and its characteristics can be effected to avoid problematic wear.

Figure 5:
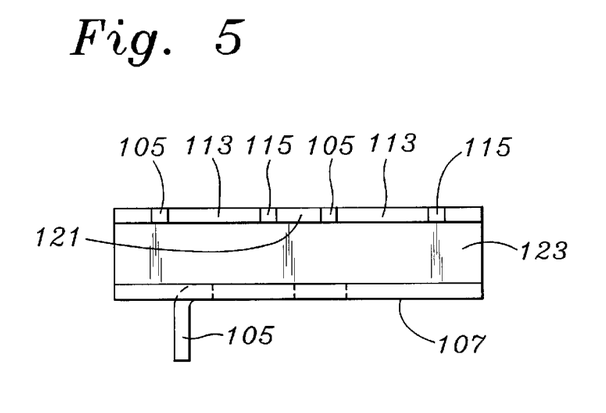
FIG. 5 illustrates a top view of the bracket of FIG. 3 to further illustrate the geometry thereof.

Washer 129 may preferably be about 1⅛ inches in diameter. Further detail is seen in FIG. 5 illustrating a top view. As can be seen from FIGS. 5 and 3, the alignment stop 105 may be bendable from a single extent of material from which the bracket 53 is formed.

Figure 6:
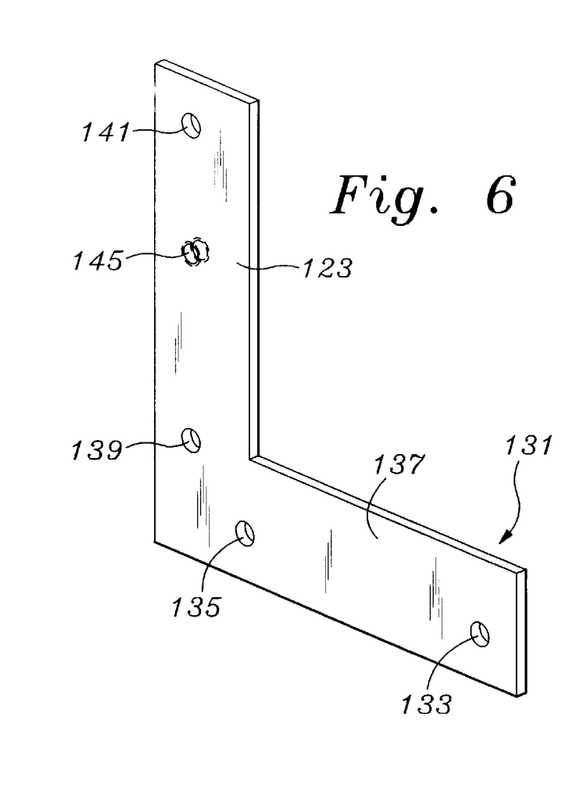
FIG. 6 is a perspective view of an "L" shaped bracket for engaging a rear surface of the screen frame of FIGS. 1 & 2 and from which the threaded bolt of FIG. 4 depends in supporting the frame with respect to the bracket.

Next, the preparation of the frame 55 for support by the bracket 53 is shown. Referring to FIG. 6, a corner angle bracket 131 is seen. This "L" shaped bracket includes a pair of mounting apertures 133 and 135 on a first leg 137, and a pair of mounting apertures 139 and 141 on a second leg 143. Frame 55 is pre drilled in order to align such pre drilled holes with bracket 131. The brackets 131 not only provide a spreading of the force of support., but assist in holding individual extrusions 61 together where such individual extrusions are used to construct frame 55. A threaded bore 145 is provided for engaging the bolt 135 and in transmitting support to the remainder of the frame 55.

Figure 7A:
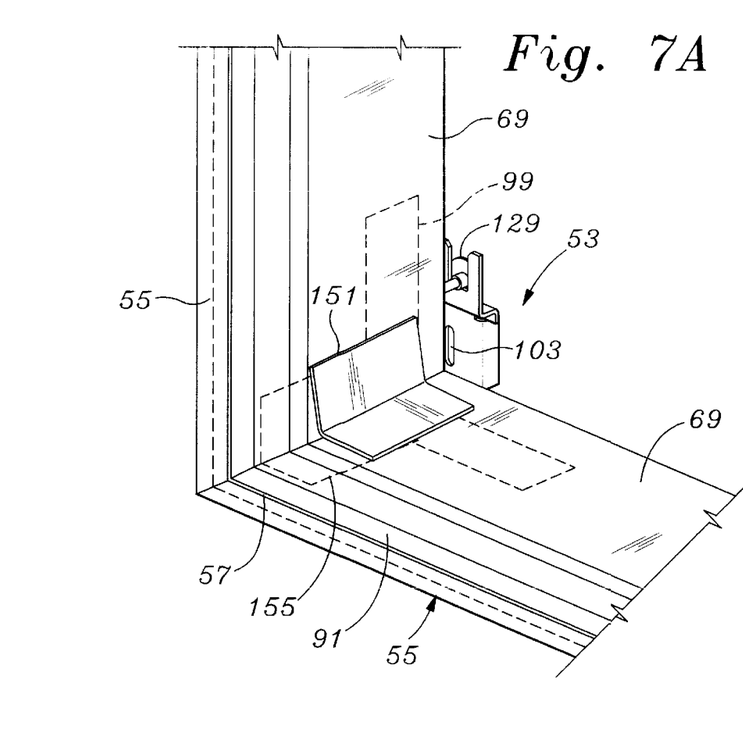
FIG. 7A is a view of an inside corner of the bracket showing dimensional details of an inside gusset, and external spacers.
Figure 7B:
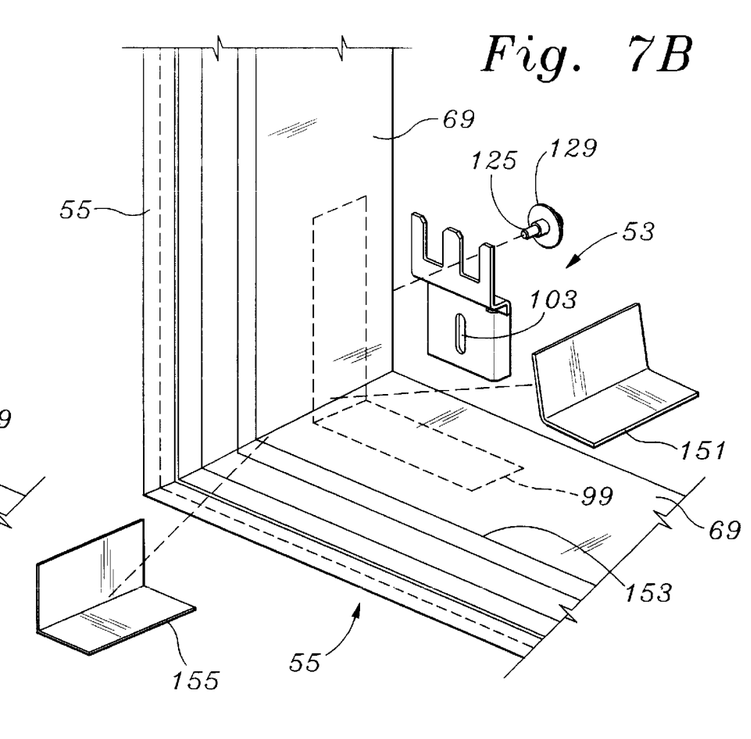
FIG. 7B is a somewhat exploded view with respect to the view of FIG. 7A to further illustrate the relational placement of the external tape and internal gusset, as well as the placement approach of the bracket, occupying the nearer of the two slots.

Referring to FIG. 7A, a view of an inside lower corner of frame 55 is seen, with respect to bracket 53. Aside from the presence of bracket 53, the corner of the frame 55 is equivalent to all of the other corners of bracket 55. Also seen is an internal gusset 151, and surface 69 on the inside of the frame 55 which is engaged by the gusset 151. The gusset 151 engages the inside of the extrusions 61 and provides tensioning for the corners. Also seen is a length of external fiberglass tape 155 which covers and finishes the edge of the frame 55. Short width of black tape 91 is also seen. Referring to FIG. 7B, a somewhat exploded view as in FIG. 7A illustrates the approach of the bracket, gusset, and external tape.

Referring to FIG. 8, a side view of the assembled frame 55 and illustrating the manner of support by the bracket 53 is seen. The angled nature of the internal gusset 151 is seen, along with the spacer 99 and external fiberglass tape 155. Also illustrated in FIG. 8 is an exploded view of the preferred embodiment by which the thicker width of polycarbonate layer 93 is adhered to the frame 55 as by a layer of adhesive, such as adhesive transfer tape 161 having a double sided adhesive. By using the adhesive transfer tape 161, the thicker width of polycarbonate layer 93 can be utilized without any special treatment or processing of the the thicker width of polycarbonate layer 93 to apply an adhesive layer. The use of the double sided adhesive transfer tape 161 also enables a non adhesive black tape 91 to be used, perhaps even much thinner than would be commercially available with its own adhesive. Also seen in a somewhat exploded view is the layer of the external spacer 99 at the bottom underside of the frame.

While the present invention has been described in terms of a video wall system for lending non-distortion causing support to a multiple number of video screens, one skilled in the art will realize that the structure and techniques of the present invention can be applied to many similar appliances. The present invention may be applied in any situation where the principles of physical independence, or a somewhat "floating system," employing at least some thermal expansion matching, centroid expansion dimension splitting combined with front to back progressive dimensional freedom and which contribute to the overall independence of each of several elements operating in unison in a wide range of specified ambient operating conditions is desired.

Although the invention has been derived with reference to particular illustrative embodiments thereof, many changes and modifications of the invention may become apparent to those skilled in the art without departing from the spirit and scope of the invention. Therefore, included within the patent warranted hereon are all such changes and modifications as may reasonably and properly be included within the scope of this contribution to the art.

What is claimed:

1. A video screen system comprising:
   at least a first screen having a first height and a first width, a front face and a rear face separated by an edge, said at least a first screen having a first thermal expansion coefficient;
   at least a first frame having a first end having a second height and a second width substantially matching said first height and said first width of said at least a first screen, and a second end, said at least a first frame having a second thermal expansion coefficient;
   a width of flexible material surrounding each of said at least a first screen and said at least a first frame when said screen and said first end of said at least a first frame are in substantially adjacent but spaced apart relationship, to attach said at least a first screen in a spaced apart relationship with respect to said front end of said at least a first frame and to allow some lateral movement of said at least a first screen with respect to said at least a first frame;
   a primary vertical support for said at least a first screen comprising at least one of an underlying support and a vertically adjacent screen;
   a secondary support for said at least a first frame which enables said at least a first frame to move at least one of a limited amount vertically.

2. The video screen system as recited in claim 1 wherein said secondary vertical and lateral support for said frame also enables said frame to move at least a limited amount horizontally.

3. The video screen system as recited in claim 2 wherein said secondary support for said frame further comprises a bracket having a first portion and a slot portion spaced apart from said first portion, said slot portion having at least a first slot for at least partially supporting said at least a first frame.

4. The video screen system as recited in claim 3 wherein said bracket slot portion also has at least a second slot for at least partially supporting at least a second frame.

5. The video screen system as recited in claim 4 wherein said at least a first slot and said at least a second slot are sized to provide a limit enabling said frame to move said at least a limited amount vertically and horizontally.

6. The video screen system as recited in claim 5 and further comprising at least one protruding member having a first end engaged into said at least one frame and a second end engaged by said at least a first slot and wherein said at least a first slot is sized to provide a limit enabling said frame to move said at least a limited amount vertically and horizontally.

7. The video screen system as recited in claim 1 and wherein said width of flexible material surrounding each of said at least a first screen and said at least a first frame is a first width of flexible material, and further comprising a second width of flexible material attached to said first width of flexible material and concentrically within said first width of flexible material as said first width of flexible material surrounds at least said first screen and said at least a first frame in order to further block light from being transmitted through said first width of flexible material.

8. The video screen system as recited in claim 7 and further comprising a layer of adhesive transfer tape between said first width of flexible material and at least one of said first screen and said at least a first frame and said second width of flexible material.

9. The video screen system as recited in claim 7 wherein said first and said second thermal expansion coefficient are substantially similar.

10. The video screen system as recited in claim 7 wherein said width of flexible material is polycarbonate material.

11. A video screen system comprising:
a plurality of screens, each having a first height and a first width, a front face and a rear face separated by an edge, said plurality of screens in abutting edge to edge relationship with each other;
a plurality of frames, each having a first end having a second height and a second width substantially matching said first height and said first width of said at least a first screen, and a second end, each one of said plurality of screens associated with one of said plurality of frames;
a membrane joining each one of said plurality of screens with its associated one of said plurality of frames in a spaced apart relationship enabling lateral movement of each one of said plurality of frames with its associated one of said plurality of screens so that expansion and contraction of said plurality of screens is at least minimally de-coupled from expansion and contraction of said plurality of frames.

12. The video screen system as recited in claim 11 and further comprising a primary vertical support member supporting at least one of said plurality of screens so that said plurality of screens can expand and contract from a vertical reference point.

13. The video screen system as recited in claim 11 and further comprising a primary support member mechanically linked to at least one of said plurality of frames to restrict movement of at least one of any of said plurality of said frames in a at least one of a frontal direction toward in its associated one of said plurality of screens and a rearward direction away from its associated one of said plurality of screens.

14. The video screen system as recited in claim 13 and wherein said primary support member mechanically linked to at least one of said plurality of frames to restrict movement of at least one of any of said plurality of said frames in a at least one of a frontal direction toward in its associated one of said plurality of screens and a rearward direction away from its associated one of said plurality of screens enables said at least one frame to move at least a limited amount vertically.

15. The video screen system as recited in claim 13 and wherein said primary support member mechanically linked to at least one of said plurality of frames to restrict movement of at least one of any of said plurality of said frames in a at least one of a frontal direction toward in its associated one of said plurality of screens and a rearward direction away from its associated one of said plurality of screens enables said at least one frame to move at least a limited amount horizontally.

16. The video screen system as recited in claim 11 wherein said plurality of screens have a first thermal expansion coefficient and said plurality of frames have a second thermal expansion coefficient, and wherein said first and said second thermal expansion coefficient are substantially similar.

17. The video screen system as recited in claim 11 wherein said membrane contains polycarbonate material.

* * * * *